(12) United States Patent
Konshak

(10) Patent No.: US 7,312,987 B1
(45) Date of Patent: Dec. 25, 2007

(54) ADAPTABLE THIN PLATE MODULAR HEAT EXCHANGER BLADE FOR COOLING ELECTRONIC EQUIPMENT

(75) Inventor: Michael V. Konshak, Louisville, CO (US)

(73) Assignee: Storage Technology Corporation, Louisville, CO (US)

( * ) Notice: Subject to any disclaimer, the term of this patent is extended or adjusted under 35 U.S.C. 154(b) by 39 days.

(21) Appl. No.: 11/298,766

(22) Filed: Dec. 9, 2005

(51) Int. Cl.
*G06F 1/16* (2006.01)

(52) U.S. Cl. ............... 361/687; 361/699; 165/80.4; 257/715

(58) Field of Classification Search ........ 361/679–688, 361/724–727, 699, 689; 165/80.4, 121; 257/715
See application file for complete search history.

(56) References Cited

U.S. PATENT DOCUMENTS

| 6,827,131 B1 * | 12/2004 | Chang | 165/80.4 |
| 2003/0205363 A1 * | 11/2003 | Chu et al. | 165/80.3 |
| 2005/0128705 A1 * | 6/2005 | Chu et al. | 361/699 |

OTHER PUBLICATIONS

HP Debuts water-cooling system, CNET News.co, pp. 1-4.
Emerson Network Power and Egenera Introduce CoolFrame™ Integrated Cooling Solution for Egenera® System, www.Liebert.com.

* cited by examiner

*Primary Examiner*—Hung Van Duong
(74) *Attorney, Agent, or Firm*—Brooks Kushman P.C.

(57) ABSTRACT

A computer peripheral system is provided that include at least one fluid cooled blade. The fluid cooled blade is formed by first and second walls that are secured together to form a fluid flow path. A supply of cooling fluid is connected to an inlet port to supply cooling fluid to the fluid flow path. An outlet port is connected to the fluid flow path that directs fluid to a fluid outlet. The fluid cooled blade is assembled to the rack in close proximity to the electronic modules that require cooling. In one embodiment, the fluid cooled blade may be laminated or otherwise connected to one or more electronic circuit boards.

19 Claims, 3 Drawing Sheets

ADAPTABLE THIN PLATE MODULAR HEAT EXCHANGER BLADE FOR COOLING ELECTRONIC EQUIPMENT

BACKGROUND OF THE INVENTION

1. Field of the Invention

The present invention relates to apparatus for cooling electronic equipment.

2. Background Art

Electronic equipment such as personal computers, network servers, tape storage systems, and disk storage systems generate heat during operation. These types of devices should be cooled to optimize performance. In the prior art, air circulation fans were used to circulate ambient air across electronic components for cooling purposes. Larger and more powerful systems tend to generate more heat and are difficult to cool by circulating air around electrical components. If heat is allowed to build up, performance of the electronic equipment may be degraded.

It has been proposed to use water to cool electronic systems. Using water to cool electronic components can only be accomplished if water is prevented from actually contacting electronic components. Cray and IBM computer systems have had fixed cooling systems that are integrated as part of the design that are similar to automotive cooling systems or refrigeration systems. It has been proposed by others to use a cabinet that has a water circulation system in the walls of the cabinet to cool electronic components housed within the cabinet. One problem with this approach is that heat build up generally occurs in the interior of the electronic component rack. Cooling the walls of the cabinet is not particularly effective as cooling the internal areas of an electronic equipment rack.

The present invention is directed to overcome the above problems and address the need for a modular heat exchanger blade for cooling electronic equipment. In particular, the present invention addresses the need for providing a blade type heat exchanger for cooling high density electronic devices such as disk drive arrays, servers, and the like. There is also a need for a modular water cooling system that may be retrofitted to existing high density electronic devices to address the problem of heat build up on current products. Finally, there is a need for a modular cooling system having individual elements that can be repositioned, removed, or supplemented as the configuration and requirements of the computer system changes.

The present invention is directed to solving the above problems and others as summarized below.

SUMMARY OF THE INVENTION

According to one aspect of the present invention, a computer peripheral system is provided to which a plurality of electronic modules are assembled. A fluid cooled blade is provided that has first and second walls that are secured together to form a fluid flow path. The fluid cooled blade has an inlet port connected to a supply of cooling fluid, such as water or a liquid coolant, that is supplied to the fluid flow path formed by the first and second walls. The blade also has an outlet port that is connected to the fluid flow path formed by the first and second walls and a fluid outlet. The fluid cooled blade is assembled in proximity to the electronic modules for the purpose of cooling the electronic modules.

According to another aspect of the present invention, a fluid cooled blade is provided for an electronic system. The fluid cooled blade comprises the first wall that is formed as a unitary stamped member having indentations. A second wall is likewise formed as a unitary stamped member having indentations in complementary locations to the indentations in the first wall. The first and second walls are secured together to form a fluid flow path through the blade. An inlet port is connected to a supply of cooling fluid for supplying the cooling fluid to the fluid flow path formed by the first and second walls. An outlet port is connected to the fluid flow path formed by the first and second walls and a fluid outlet.

According to other aspects of the present invention, the first and second walls may be unitary stamped members that have indentations formed in complementary locations that form the fluid flow path between the first and second walls when the first and second walls are assembled together. The first and second walls may have an inlet channel that connects the inlet port to the fluid flow path. The inlet channels of the first and second walls are in complementary locations that form an inlet passage when assembled together. The first and second walls each have an outlet channel that connects the outlet port to the fluid flow path. The outlet channels of the first and second walls are in complementary locations so that they form an outlet passage when assembled together. The outlet passage connects the fluid flow path to the outlet port. The fluid flow path may define a plurality of integrally formed tubes that extend from the inlet passage to the outlet passage.

The fluid flow paths, or integrally formed tubes in the plate, may be routed or sized to balance heat transfer. The pressure drop from the inlet port to the outlet port should be balanced so that the flow rate of the coolant in each of the tubes are substantially equivalent. To do so, tubes closest to the inlet and outlet ports are smaller than those that are further away where the pressure drop is the greatest.

According to other aspects of the invention, the inlet and outlet ports may be connected to the supply of cooling fluid by first and second quick release fittings. The cooling fluid supplied may be chilled water, a coolant or a refrigerant.

According to another aspect of the present invention, the plurality of electronic modules may include high density electronic devices that are mounted on blades and the computer peripheral may be a personal computer, network server, tape storage system or disk storage system.

According to another aspect of the present invention, the fluid cooled blade may be secured to the rack between at least two of the electronic modules. The fluid cooled blade may be secured to one or more electronic circuit boards in a laminated, or layered, construction to form a module. Alternatively, the plurality of electronic modules may include high density electronic devices that are assembled in rows and the fluid cooled blade may be assembled between the rows.

These and other aspects of the present invention will be better understood in view of the attached drawings and following detailed description of the illustrated embodiments.

DETAILED DESCRIPTION OF THE PREFERRED EMBODIMENT(S)

Figure 1:
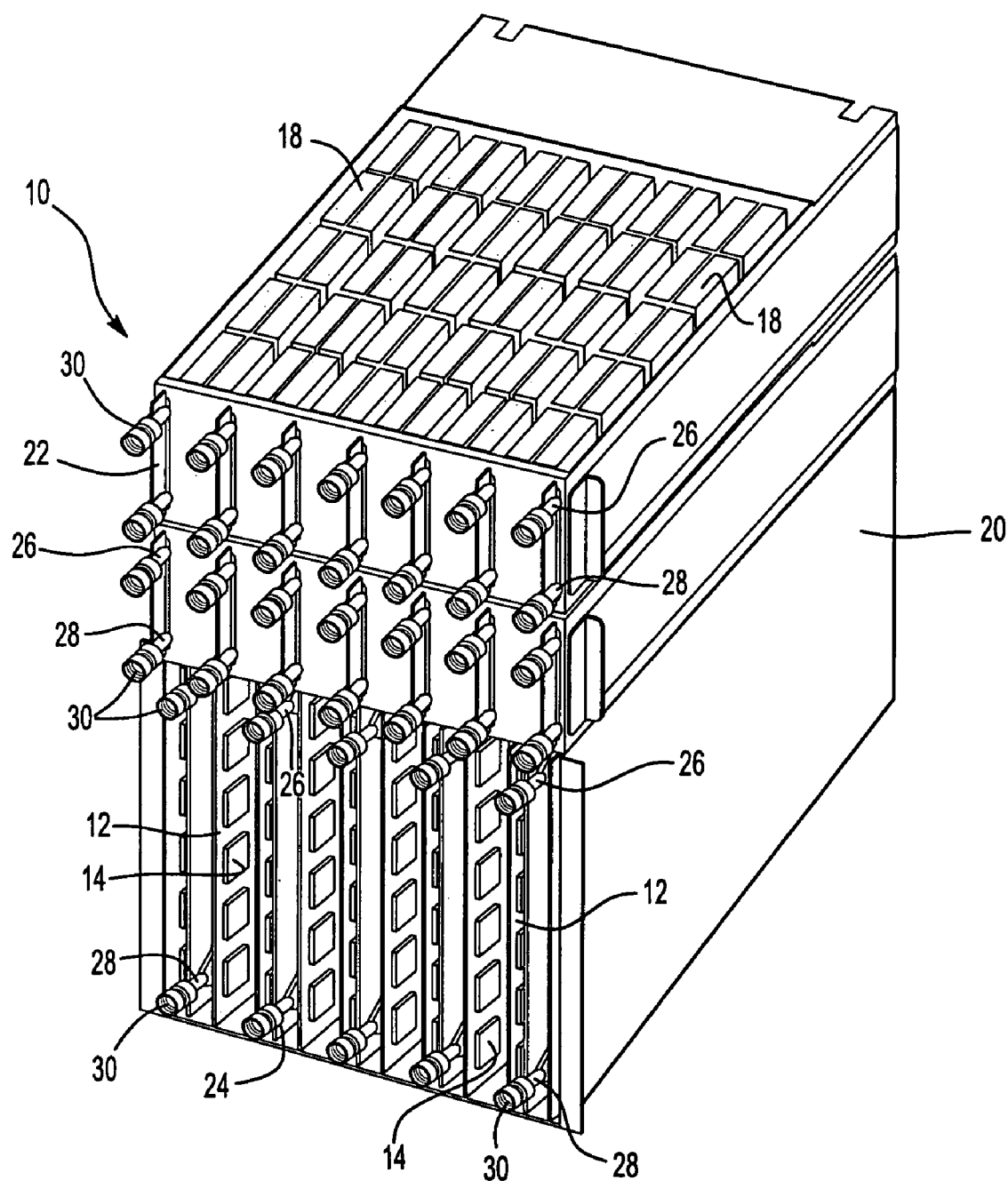
FIG. 1 is a perspective view of a computer peripheral system made according to our embodiment of the present invention.

Referring to FIG. 1, a computer peripheral system 10 is illustrated. A plurality of electronic circuit boards 12 that support electronic components 14 such as microprocessor chips, resistors, capacitors, and the like are provided as part of the system 10. The computer peripheral system 10 also may include a plurality of disk drives 18. A housing 20 is provided for housing electronic circuit boards 12 and disk drives 18.

A first set of fluid cooled blades 22 is provided between rows of the disk drives 18. A second set of fluid cooled blades 24 are provided between the electronic circuit boards 12. The fluid cooled blades 20, 22 each have an inlet port 26 and an outlet port 28 through which water or a cooling fluid may be circulated. The inlet and outlet ports 26, 28 each have a drip proof quick connect fitting 30. Hoses or tubes may be connected to each of the quick connect fittings 30 to supply and discharge a fluid such as water, a coolant or a refrigerant that may be circulated through the blades 22, 24. An example of a drip proof quick connect fitting 30 is sold by Colder Products and is described as a quick connect leak free or drip free coupling.

Figure 2:
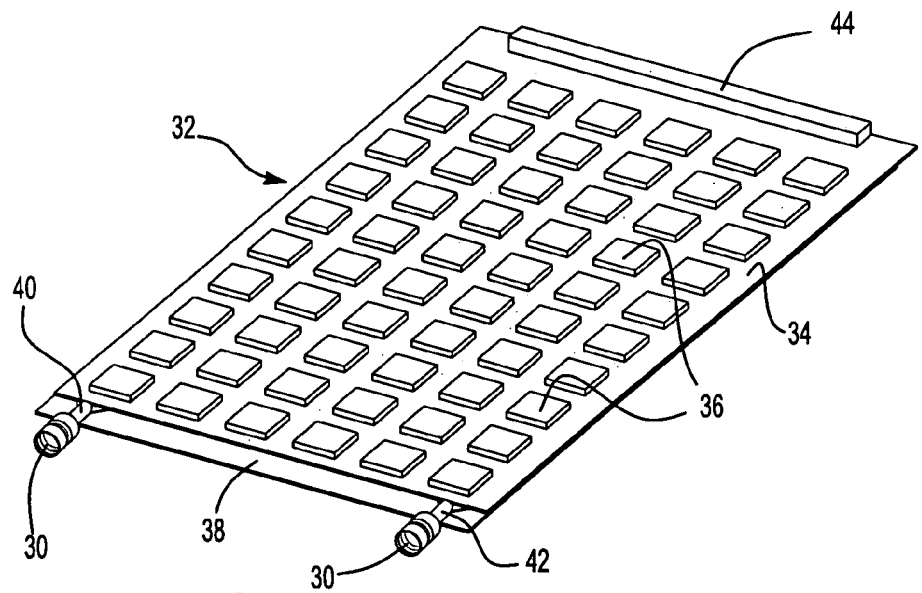
FIG. 2 is a perspective view of a circuit board that is laminated to a fluid cooled blade according to one embodiment of the present invention.

Referring to FIG. 2, a laminated embodiment of a laminated fluid cooled blade 32 is shown that includes one or more laminations comprising circuit boards 34 to which a plurality of microprocessors 36 or other electronic components may be operatively secured. The fluid cooled blade 38 may have a single circuit board 34 laminated to one side or may have two circuit boards 34 laminated to opposite sides. Alternatively, the fluid cooled blade 38 could be laminated with two back to back circuit boards 34 on each side.

The circuit boards 34 may be laminated to the fluid cooled blade 38 by means of a phase change polymer foam that is not electrically conductive but is made of a phase change thermal interface material that limits the extent of thermal insulation of the foam. The phase change polymer foam may be coated with a pressure sensitive adhesive on one or both sides to facilitate laminating the circuit board 34 to the fluid cooled blade 38. An example of a phase change polymer foam material suitable for this purpose may be obtained from 3M Corporation, that sells the phase change material under the product no. series 98XX. Alternatively, a Dow Corning phase change thermal interface material, such as product no. PC4323 may used to laminate the circuit boards 34 to the fluid cooled blade 38.

Alternatively, the laminations could be formed by providing mechanical fasteners between circuit boards that are held in close proximity to the fluid cooled blade 38.

Figure 3:
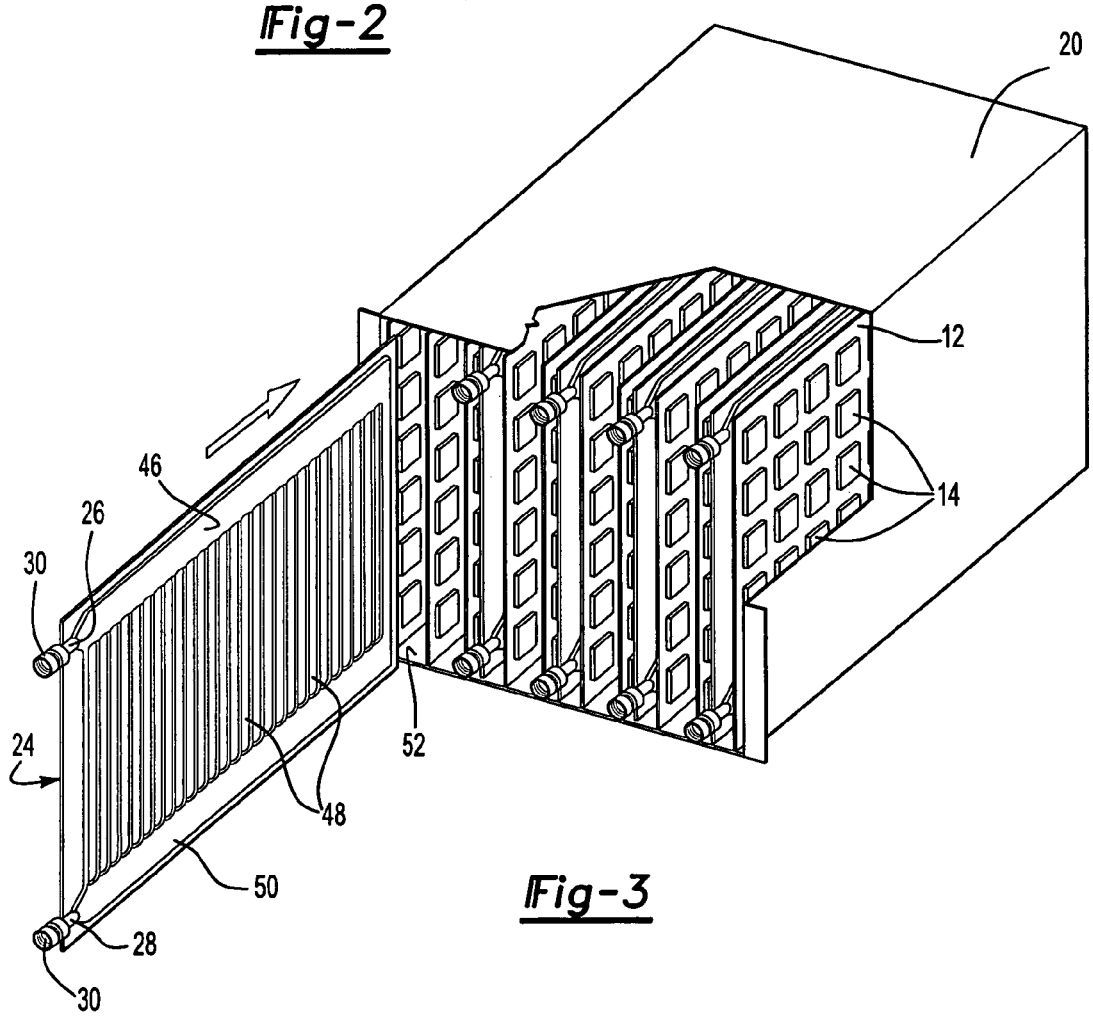
FIG. 3 is a perspective view of a computer peripheral system including a plurality of circuit boards disposed in the housing with a plurality of fluid cooled blades.

Referring to FIGS. 2 and 3, the fluid cooled blades include an inlet port 40 and an outlet port 42 through which a fluid is provided to the fluid cooled blade 38. A connector 44 may be provided for connecting the fluid cooled blade 38 to the back plane of the computer peripheral system 10. An inlet channel 46 is provided in the interior of the fluid cooled blade 38 that provides fluid to a plurality of fluid flow paths 48 through which fluid is directed to an outlet channel 50 and in turn to the outlet port 42. The fluid cooled blade 38 may be inserted into the housing 20 in space 52, or a rack slot, located between two adjacent circuit boards 34.

Figure 4:
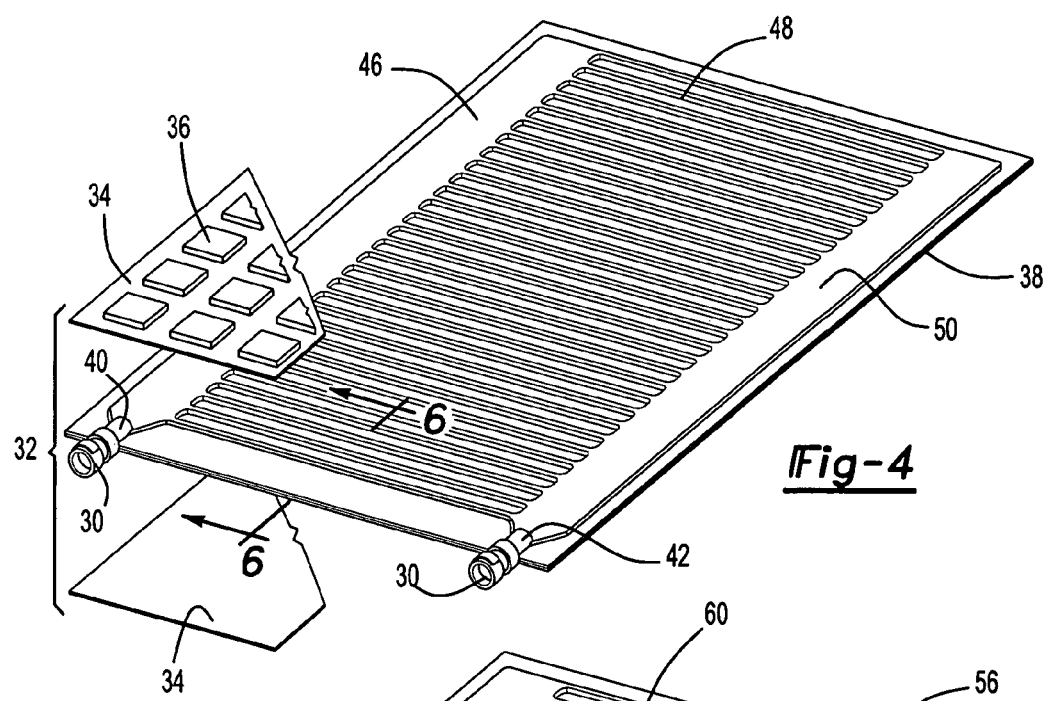
FIG. 4 is an exploded fragmentary perspective view of fluid cooled blade having a circuit board laminated to opposite sides thereof.

Referring to FIG. 4, the laminated embodiment 32 is shown in exploded perspective. A fragment of a circuit board 34 is shown that supports a plurality of microprocessors or other electronic components. Two circuit boards 34 are laminated to opposite sides of the fluid cooled blade 38. The fluid is provided to the fluid cooled blade 38 through inlet port 40 that provides fluid to an inlet channel 46 formed within the fluid cooled blade 38. Fluid passes from the inlet port to the inlet channel 46 to fluid flow paths 48 defined within the body of the fluid cooled blade 38. Fluid flowing from the fluid flow paths 48 is received in the outlet channel 50. Fluid flows from the outlet channel 50 to the outlet port 42. The fluid may be provided in an open system or a closed system. In an open system, fluid such as water may be obtained from a source and routed through the fluid cooled blade 38 where it performs its cooling function and then is directed from the outlet port 42 to a drain. In a closed system, a reservoir of cooling fluid or a refrigeration system may be provided that provides cool fluid to the inlet port and removes the warmed fluid from the outlet port 42.

Figure 5:
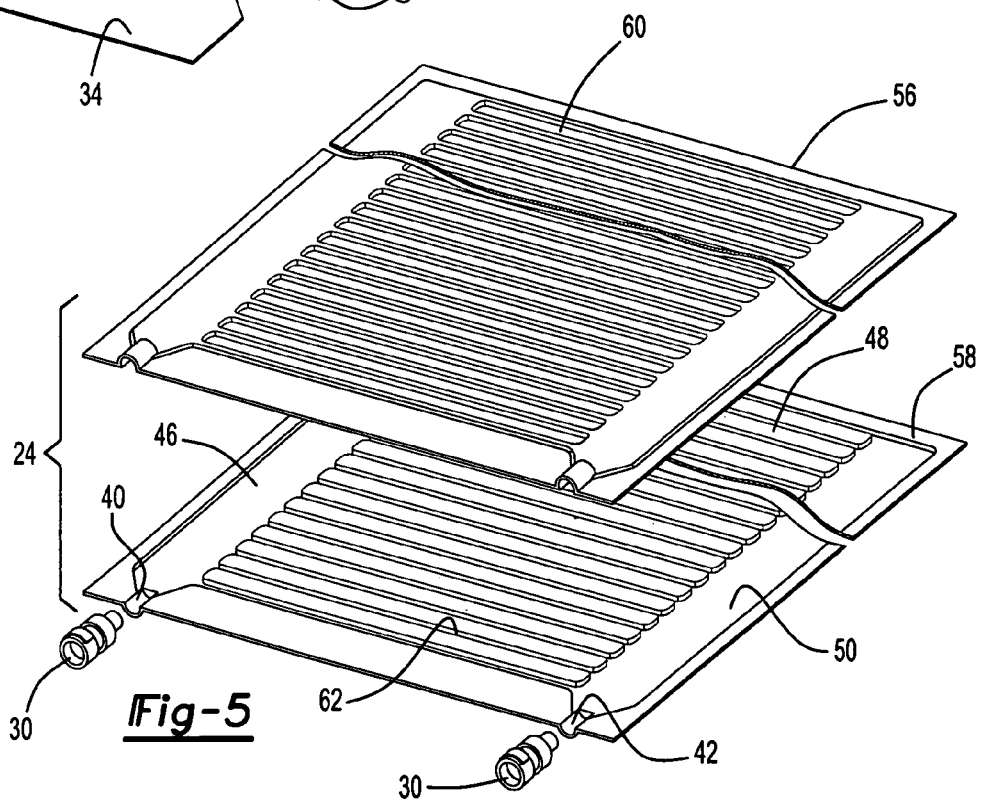
FIG. 5 is an exploded perspective view of a fluid cooled blade made according to the present invention.

Referring to FIG. 5, a fluid cooled blade 24 is shown in an exploded perspective view. The fluid cooled blade 24 includes a first wall 56 that is mated with a second wall 58. The first wall includes a first set of indentations 60 that are aligned with a second set of indentations 62 in the second wall 58. The location of the first and second sets of indentations 60 and 62 may be complimentary or mirror images so that when the indentations 60, 62 are aligned fluid flow passages are defined between the first and second walls 56 and 58. Alternatively, discrete tubes could be provided for the circulating of fluid through the blade.

Figure 6:
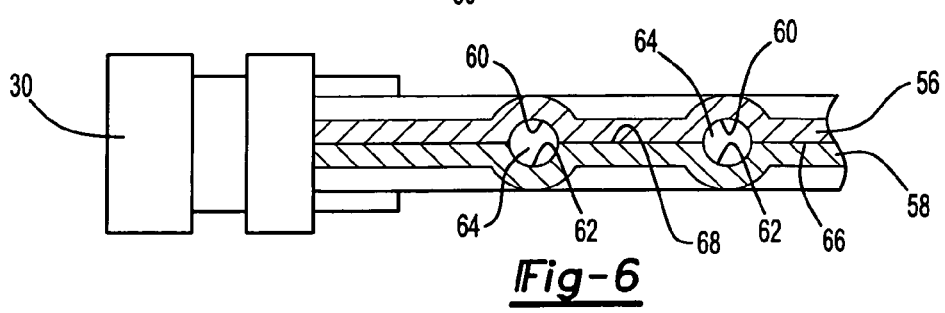
FIG. 6 is a cross-sectional view taken along line 6-6 taken in FIG. 4.

Referring to FIG. 6, a plurality of cylindrical passages 64 are shown that are created when the first and second sets of indentations 60 and 62 of the first and second walls 56 and 58 are aligned. The fluid flows through the cylindrical passages 64 from the inlet channel 46 to the outlet channel 50. A first attachment surface 66 is provided on the first wall 56. A second attachment surface 68 is provided on the second wall 58. The first and second attachment surfaces may be connected together by means of mechanical fasteners, a bonding or adhesive agent, by welding, or soldering. When the first and second walls 56 and 58 are assembled together the bond between the walls prevents fluid from flowing through the fluid cooled blade 24, except for fluid that flows through the cylindrical passages 64.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A computer peripheral system, comprising:
a plurality of electronic modules;
a fluid cooled blade having a first wall and a second wall that are unitary members that have integrally formed indentations in complementary locations that form a fluid flow path between the first and second walls when the first and second walls are assembled together to form the fluid flow path, an inlet port is connected to a supply of a cooling fluid, the inlet port supplies the cooling fluid to the fluid flow path formed by the first and second walls, an outlet port is connected to the fluid flow path formed by the first and second walls and a fluid outlet; and wherein the fluid cooled blade is assembled in proximity to the electronic modules to cool the electronic modules.

2. The computer peripheral system of claim 1 wherein the first and second walls each have an inlet channel that connects the inlet port to the fluid flow path, the inlet channels of the first and second walls being in complementary locations that form an inlet passage when assembled together that connects the inlet port to the fluid flow path, and wherein the first and second walls each have an outlet channel that connects the outlet port to the fluid flow path, the outlet channels of the first and second walls being in complementary locations that form an outlet passage when assembled together that connects the fluid flow path to the outlet port.

3. The computer peripheral system of claim 2 wherein the fluid flow path defines a plurality of integrally formed tubes that extend from the inlet passage to the outlet passage, and wherein the integrally formed tubes are configured to balance the temperature of the coolant and removal of heat from the computer peripheral system.

4. The computer peripheral system of claim 1 wherein the supply of cooling fluid is water.

5. The computer peripheral system of claim 1 wherein the supply of cooling fluid is a refrigerant.

6. The computer peripheral system of claim 1 wherein the plurality of electronic modules include high density electronic devices that are mounted on blades and the computer peripheral is a personal computer, network server, tape storage system, or disk storage system.

7. The computer peripheral system of claim 6 wherein the blades on which the electronic modules are mounted are laminated to one or both sides of the fluid cooled blade to form a module.

8. The computer peripheral system of claim 1 wherein the plurality of electronic modules include high density electronic devices that are assembled in rows and wherein the fluid cooled blade is assembled to the rack between the rows.

9. A computer peripheral system, comprising:
a plurality of electronic modules;
a fluid cooled blade having a first wall and a second wall that are secured together to form a fluid flow path, an inlet port connected to a supply of a cooling liquid, the inlet port supplies the cooling fluid to the fluid flow path formed by the first and second walls, an outlet port connected to the fluid flow path formed by the first and second walls and a fluid outlet, wherein the inlet port is connected to the supply of cooling fluid by a first quick-release fitting and wherein the outlet port is connected to the supply of cooling fluid by a second quick-release fitting.

10. A fluid cooled blade for an electronic system, the fluid cooled blade comprising:
a first wall formed as a unitary stamped member having a first plurality of integral indentations;

a second wall formed as a unitary stamped member having a second plurality of integral indentations in complementary locations to the first plurality of indentations of the first wall, wherein the first and second walls are secured together to form a fluid flow path;

an inlet port connected to a supply of a cooling fluid and that supplies the cooling fluid to the fluid flow path formed by the first and second walls; and an outlet port connected to the fluid flow path formed by the first and second walls and a fluid outlet.

11. The fluid cooled blade of claim 10 wherein the first and second walls each have an inlet channel that connects the inlet port to the fluid flow path, the inlet channels of the first and second walls being in complementary locations that form an inlet passage when assembled together that connects the inlet port to the fluid flow path, and wherein the first and second walls each have an outlet channel that connects the outlet port to the fluid flow path, the outlet channels of the first and second walls being in complementary locations that form an outlet passage when assembled together that connects the fluid flow path to the outlet port.

12. The fluid cooled blade of claim 11 wherein the fluid flow path defines a plurality of integrally formed tubes that extend from the inlet passage to the outlet passage, and wherein the plurality of tubes are routed and sized to balance the pressure drop from the inlet passage to the outlet passage wherein the flow rate of the cooling fluid through the fluid flow path is balanced.

13. The fluid cooled blade of claim 12 wherein the plurality of tubes gradually increase in size wherein smaller tubes provided close to the inlet and outlet ports, and progressively larger tubes are provided at greater distances from the inlet and outlet ports.

14. The fluid cooled blade of claim 10 wherein the supply of cooling fluid is water.

15. The fluid cooled blade of claim 10 wherein the supply of cooling fluid is a refrigerant.

16. The fluid cooled blade of claim 10 wherein the electronic system further comprises a plurality of electronic modules that are mounted on blades.

17. The fluid cooled blade of claim 10 further comprising at least one circuit board that supports a plurality of electronic components, wherein the circuit board is assembled adjacent to the fluid cooled blade in a parallel plane to the first and second walls to form a modular assembly.

18. The fluid cooled blade of claim 17 wherein at least a first circuit board is assembled adjacent to the first wall and at least a second circuit board is assembled adjacent to the second wall.

19. The fluid cooled blade of claim 10 wherein the plurality of electronic modules include high density electronic devices that are assembled in rows and wherein the fluid cooled blade is assembled between the rows.

* * * * *